(12) United States Patent
Hsu et al.

(10) Patent No.: US 6,677,198 B2
(45) Date of Patent: Jan. 13, 2004

(54) STRUCTURE OF A LOW-VOLTAGE CHANNEL WRITE/ERASE FLASH MEMORY CELL AND FABRICATING METHOD THEREOF

(75) Inventors: Ching-Hsiang Hsu, Hsin-Chu (TW); Ching-Sung Yang, Chang-Hua Hsien (TW)

(73) Assignee: eMemory Technology Inc., Hsin-Chu (TW)

( * ) Notice: Subject to any disclaimer, the term of this patent is extended or adjusted under 35 U.S.C. 154(b) by 0 days.

(21) Appl. No.: 10/064,109

(22) Filed: Jun. 12, 2002

(65) Prior Publication Data

US 2002/0182805 A1 Dec. 5, 2002

Related U.S. Application Data

(62) Division of application No. 09/846,181, filed on May 2, 2001.

(51) Int. Cl.[7] .............................................. H01L 21/336
(52) U.S. Cl. ..................................... 438/257; 438/262
(58) Field of Search ................................ 438/257, 259, 438/262, 263, 264, 274, 301, 265, 273

(56) References Cited

U.S. PATENT DOCUMENTS

| 5,592,003 A | 1/1997 | Sato et al. |
| 5,683,923 A | 11/1997 | Shimizu et al. |
| 6,091,644 A | 7/2000 | Hsu et al. |
| 2002/0185673 A1 * | 12/2002 | Hsu et al. |

FOREIGN PATENT DOCUMENTS

| WO | WO 96/13863 | 5/1996 |

* cited by examiner

Primary Examiner—Phuc T. Dang
(74) Attorney, Agent, or Firm—Winston Hsu

(57) ABSTRACT

The present invention relates to a structure of a low-voltage channel write/erase flash memory cell and a fabricating method thereof, which structure comprises an N-substrate, a deep P-well formed on the substrate, and an N-well formed on the deep P-well. A deep p-type region and a shallow p-type region are ion-implanted in the N-well. The deep p-type region is connected to the shallow p-type region. An n-type region is ion-implanted in the deep p-type region to be electrically shorted with the deep p-type region and be used as a drain. Another n-type region is also ion-implanted at one side of the shallow p-type region to be used as a source. The present invention can apply the same voltage to the deep P-well and the N-well on the N-substrate by adding in a triple well architecture so that the leakage current capably generated can be reduced to minimum, thereby effectively reducing end voltages when performing the operation of erasing, simplifying the design complexity of a charge pump circuit required by the whole structure, and enhancing the operating efficiency.

5 Claims, 14 Drawing Sheets

STRUCTURE OF A LOW-VOLTAGE CHANNEL WRITE/ERASE FLASH MEMORY CELL AND FABRICATING METHOD THEREOF

CROSS REFERENCE TO RELATED APPLICATIONS

This application is a division of application Ser. No. 09/846,181 filed on May 2, 2001.

BACKGROUND OF INVENTION

1. Field of the Invention

The present invention relates to a structure of a low-voltage channel write/erase flash memory cell and a fabricating method thereof. The present invention can apply the same voltage to a deep P-well and an N-well on an N-substrate by adding in a triple well architecture so that the leakage current capably generated can be reduced to minimum, thereby effectively reducing end voltages when performing the operation of erasing, simplifying the design complexity of a charge pump circuit required by the whole structure, and enhancing the operating efficiency.

2. Description of the Prior Art

Flash memories have been widely used in electronic products such as portable computers or communication apparatuses because of their non-volatile functions of electrically writing and erasing. The channel Fowler-Nordheim effect is generally exploited to operate the flash memory cell structure. Because the array structure thereof becomes denser and denser, the operation of each memory cell begins to influence one another. Therefore, the array density of the memory cell structure designed by using this effect has a certain limit. FIG. 1 is a cross-sectional view of the structure of a prior art channel write/erase flash memory cell. As shown in the figure, an N-well 12 is formed on a p-type substrate 10. An n-type region 15 is ion-implanted into the N-well 12 to be used as a drain. A p-type region 16 is also implanted into the N-well 12. Another p-type region 17 is ion-implanted below the type region 15. Because the implanted depth of the p-type region 17 is much larger than that of the p-type region 16, it can be used as a P-well. The p-type region 17 is connected to the p-type region 16. Moreover, an n-type region 18 is also ion-implanted at anther end of the p-type region 16 to be used as a source. A stacked gate G is disposed above the p-type region 16.

The operation of the above prior art will not be further described. According to this prior art, the source of the flash memory cell needs not to be at the opposite side of the drain thereof, i.e., it is a separate source. Each drain corresponds to a well. Therefore, when the density increases, the drawback of penetrating the source and the drain will not arise. Therefore, the integration can be increased.

However, when performing the operation of erasing, if a lower end voltage is to be used to reduce the burden of a charge pump circuit, a positive voltage originally applied to a word line and a source line grounding voltage will be respectively changed to a small positive voltage applied to the word line and a negative voltage applied to the source line. The negative voltage of the source line applied to the N-well 12 will generate a forward bias across a p-n junction between the N-well 12 and the grounded p-type substrate 10, thereby indirectly resulting in a leakage current $I_L$ so as to fail the action of erasing.

SUMMARY OF INVENTION

The primary object of the present invention is to provide a structure of a low-voltage channel write/erase flash memory cell and a fabricating method thereof, wherein a deep P-well and an N-well are formed on an N-substrate to form a triple well architecture to let the same voltage be applied to the deep P-well and the N-well on the N-substrate so that the two voltages can be balanced, thereby avoiding forward conduction of the p-n junction and thus reducing the leakage current.

The secondary object of the present invention is to provide a structure of a low-voltage channel write/erase flash memory cell and a fabricating method thereof. The present invention can apply the same voltage to a deep P-well and an N-well on an N-substrate by adding in a triple well architecture, thereby effectively reducing end voltages when performing the operation of erasing, simplifying the design complexity of a charge pump circuit required by the whole structure, and enhancing the operating efficiency.

Another object of the present invention is to provide a structure of a low-voltage channel write/erase flash memory cell and a fabricating method thereof, which can reduce the program disturb generated when performing the operation of programming.

To accomplish the above objects, the present invention provides a structure of a low-voltage channel write/erase flash memory cell, which comprises mainly an N-substrate, a deep P-well formed on the substrate, an N-well formed on the deep P-well, and a stacked gate disposed above the N-well. A deep p-type region and a shallow p-type region are ion-implanted at predetermined positions in the N-well. An n-type region is ion-implanted in the deep p-type region to be used as a drain. Another n-type region is also ion-implanted at one side of the shallow p-type region to be used as a source. Because the present invention is operated at low voltages, the same voltage can be applied to the deep P-well and the N-well on the N-substrate to let the leakage current possibly generated be reduced to minimum.

The present invention also provides a fabricating method of the structure of a low-voltage channel write/erase flash memory cell. The proposed fabricating method comprises mainly the following steps: ion-implanting a deep P-well in an N-substrate; ion-implanting an N-well in the deep P-well; ion-implanting a shallow p-type region on the surface of the N-well; growing a tunnel oxide on the N-well and depositing a poly-Si layer; etching the tunnel oxide and the poly-Si layer; depositing an oxide-nitride-oxide (ONO) film on the etched tunnel oxide and the etched poly-Si layer; depositing a poly-Si layer on the ONO film; etching all the grown layers and the deposited layers on the N-well to form a rectangular stacked layer (two sides of the rectangular stacked layer being the exposed N-well); ion-implanting a deep p-type region in the N-well and disposed at one side of the rectangular stacked layer; and ion-implanting a plurality of n-type regions in the N-well and disposed at two sides the rectangular stacked layer.

These and other objectives of the claimed invention will no doubt become obvious to those of ordinary skill in the art after reading the following detailed description of the preferred embodiment, which is illustrated in the multiple figures and drawings.

BRIEF DESCRIPTION OF DRAWINGS

FIGS. 2A to 2L are cross-sectional views showing the process flow of a flash memory cell according to a preferred embodiment of the present invention.

DETAILED DESCRIPTION

Figure 1:
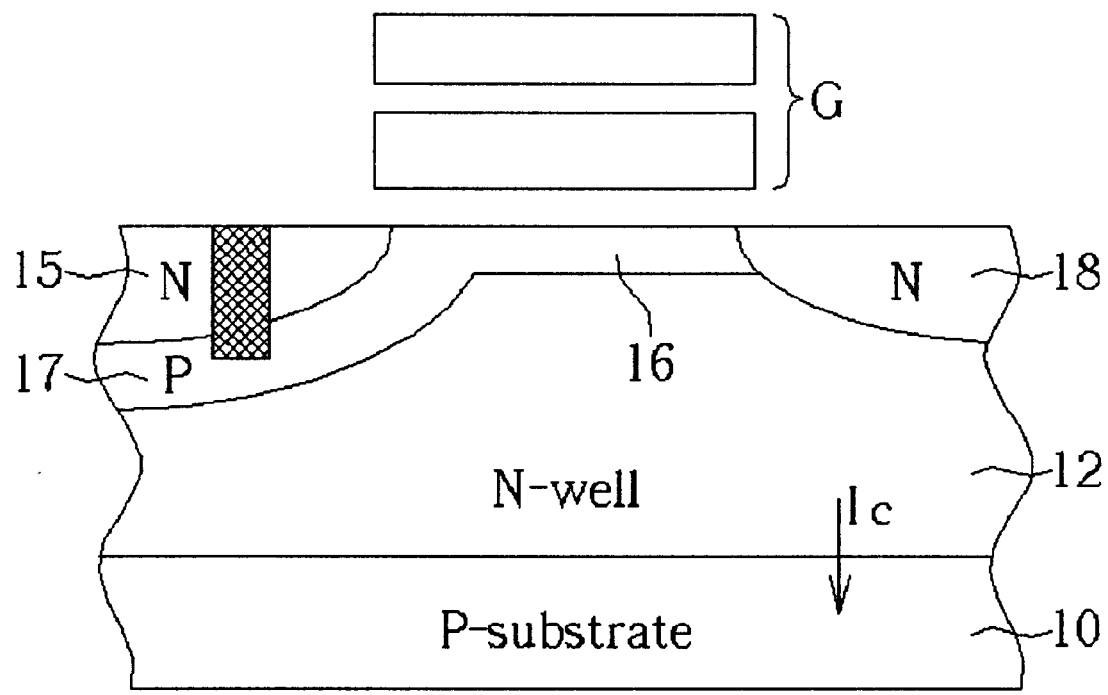
FIG. 1 is a cross-sectional view of the structure of a prior art channel write/erase flash memory cell.
Figure 2A:
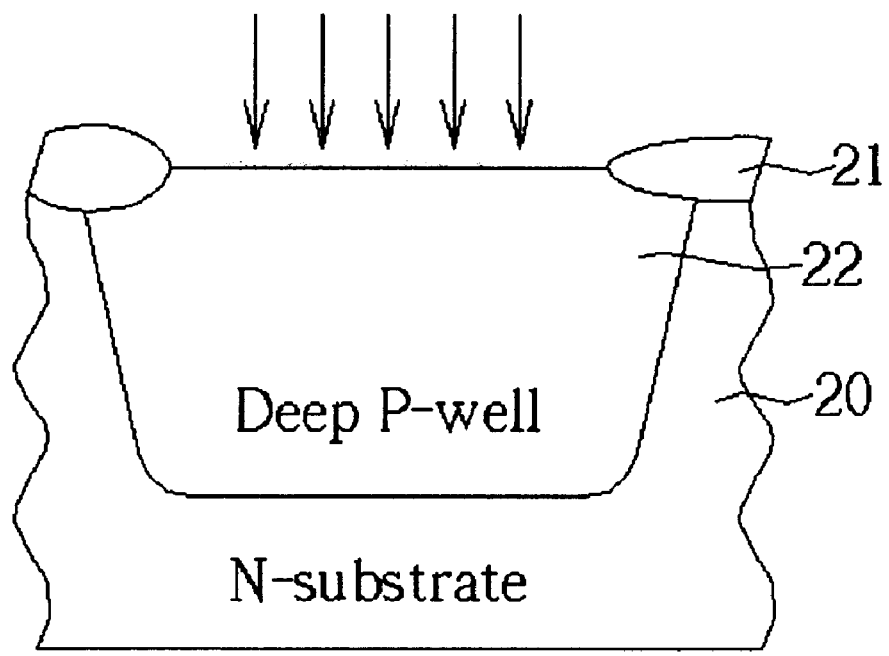
Figure 2B:
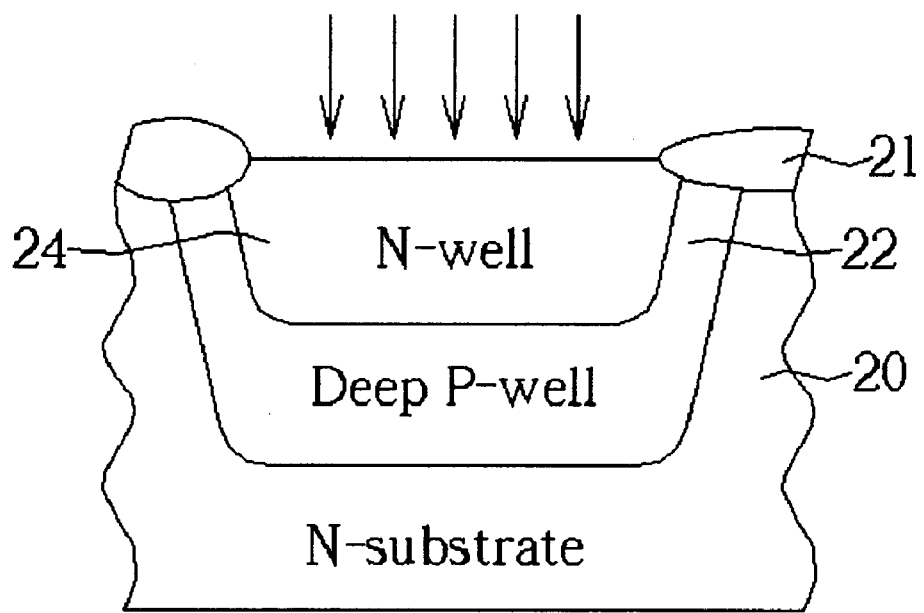
Figure 2C:
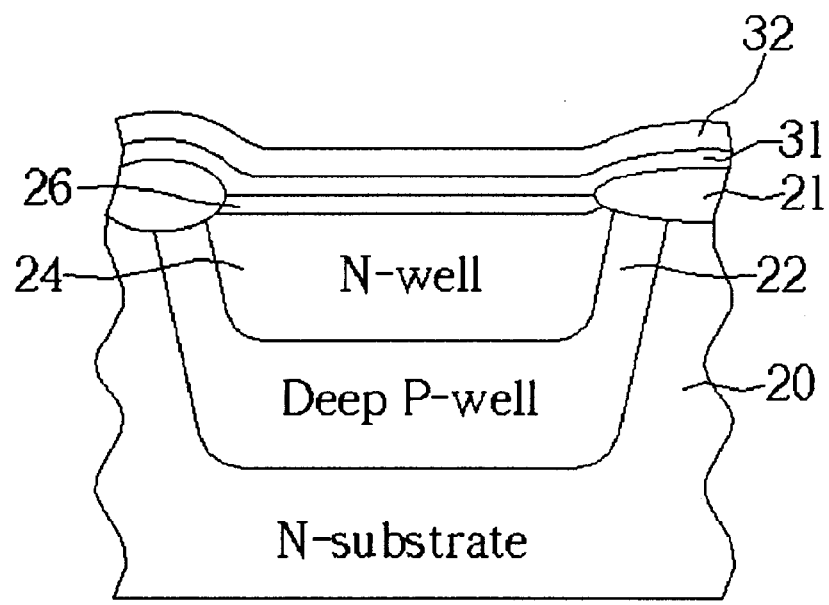
Figure 2D:
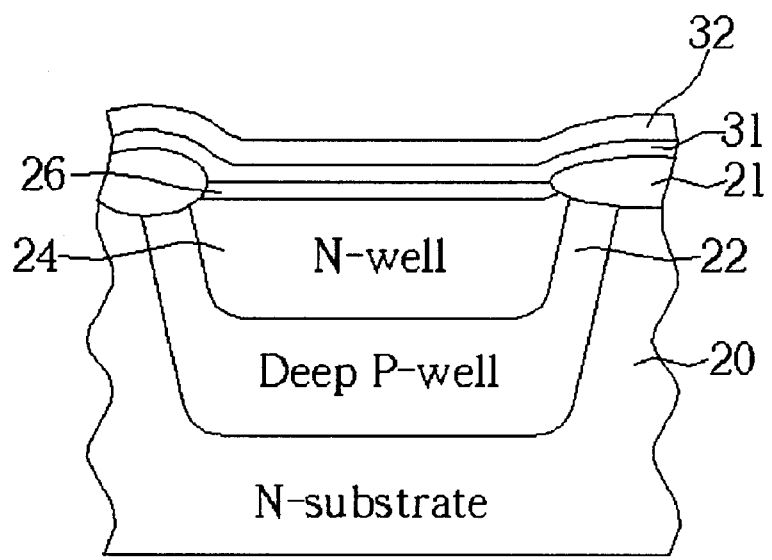
Figure 2E:
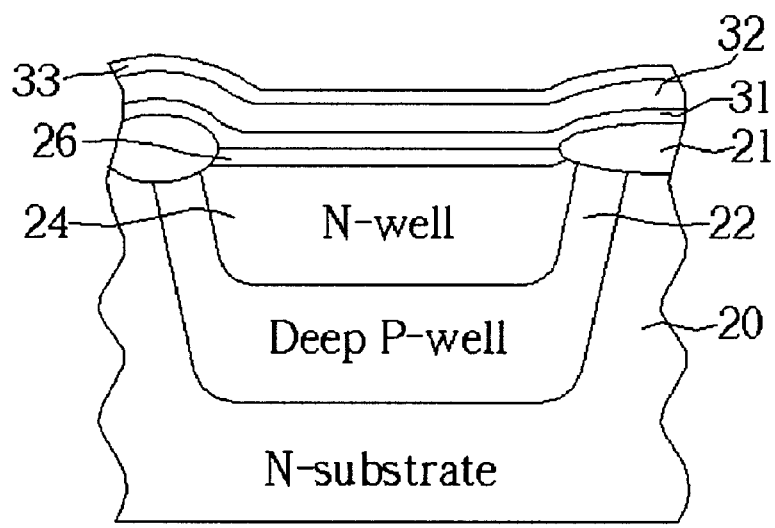
Figure 2F:
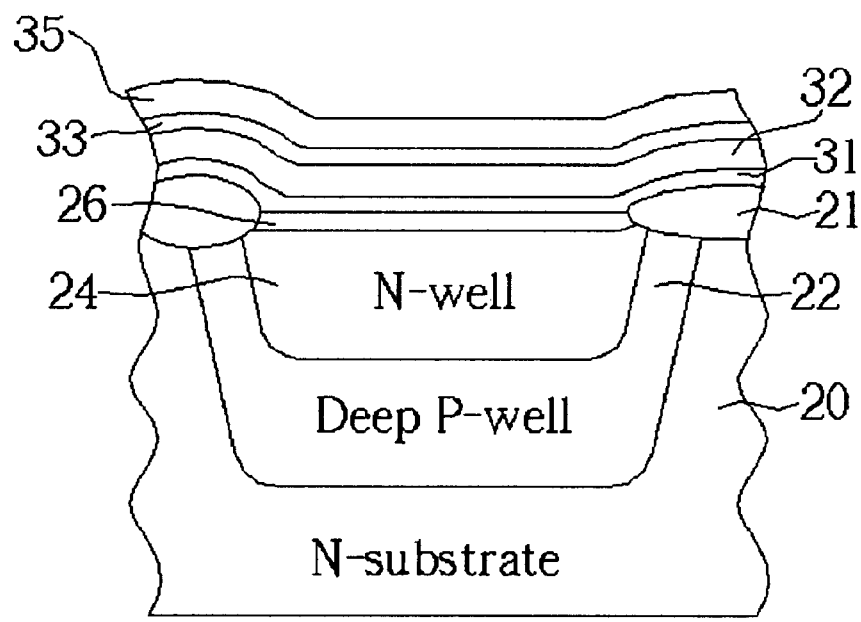
Figure 2G:
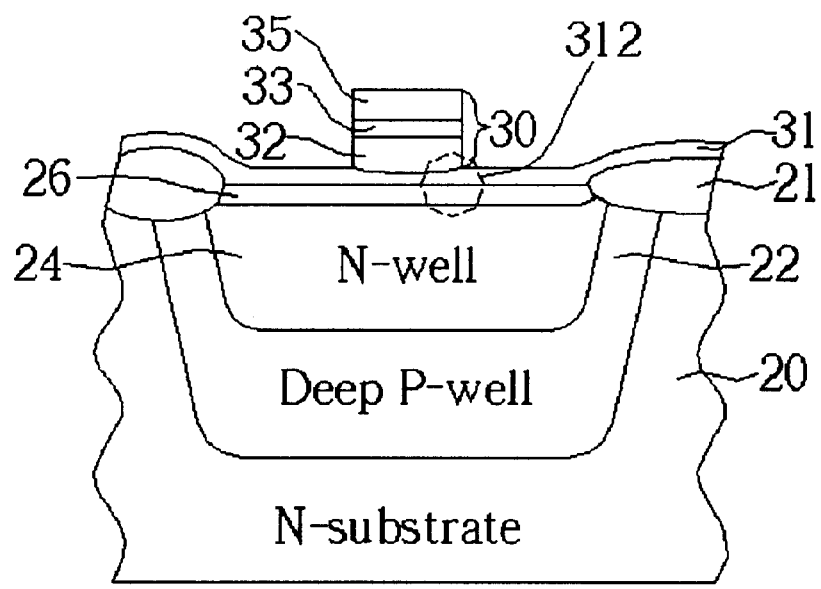
Figure 2H:
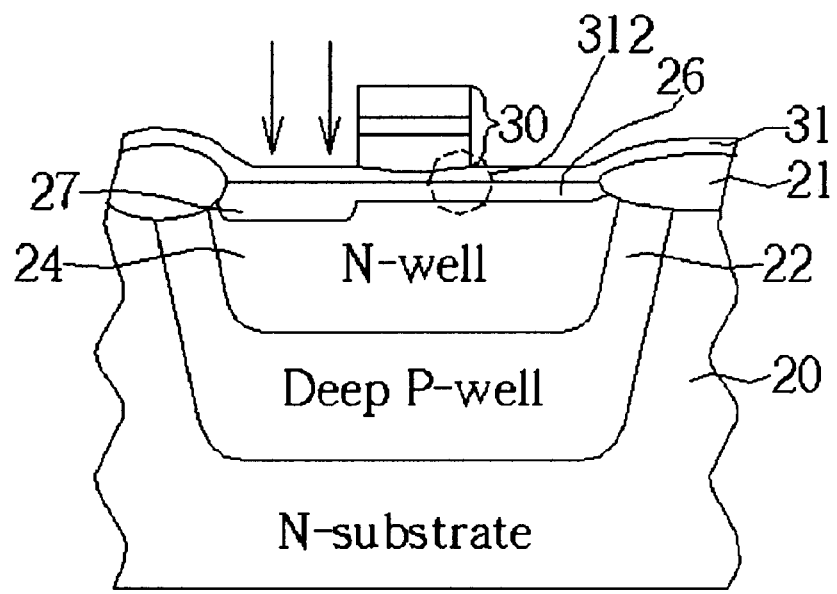
Figure 21:
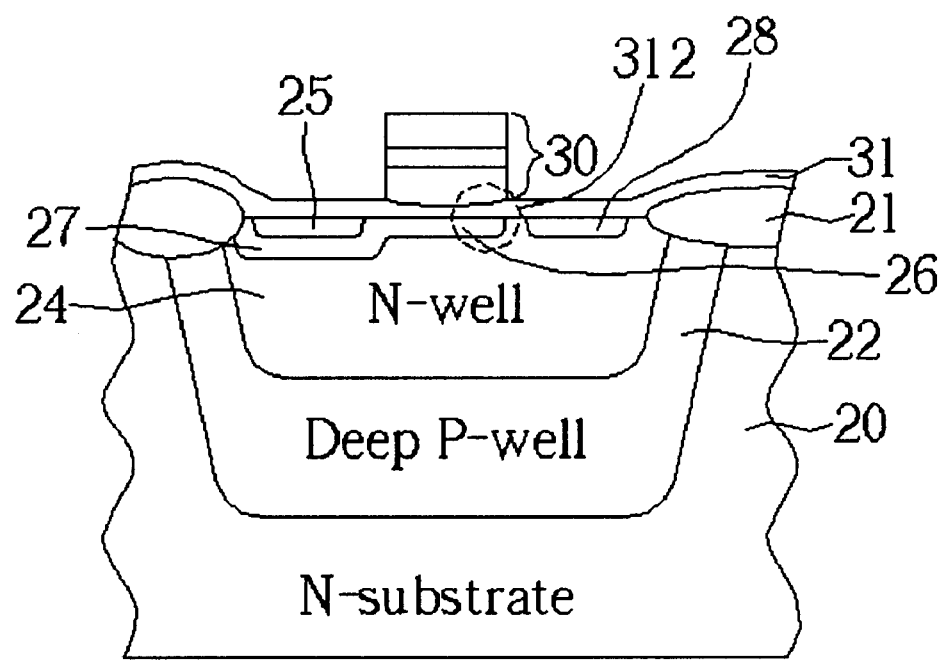
Figure 2J:
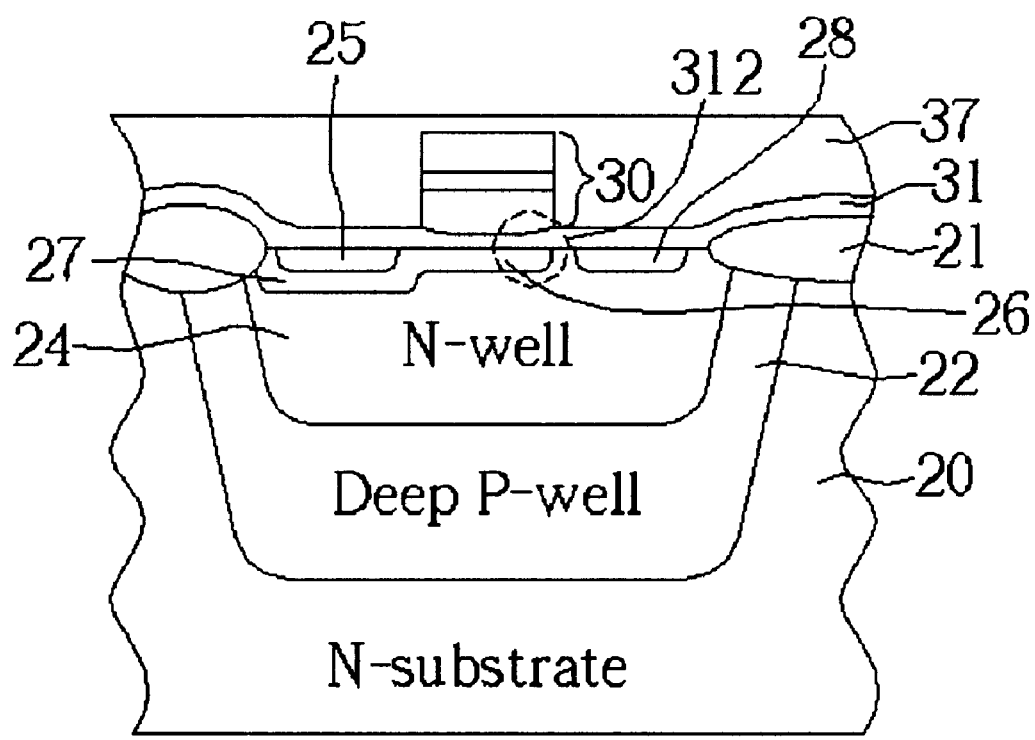
Figure 2K:
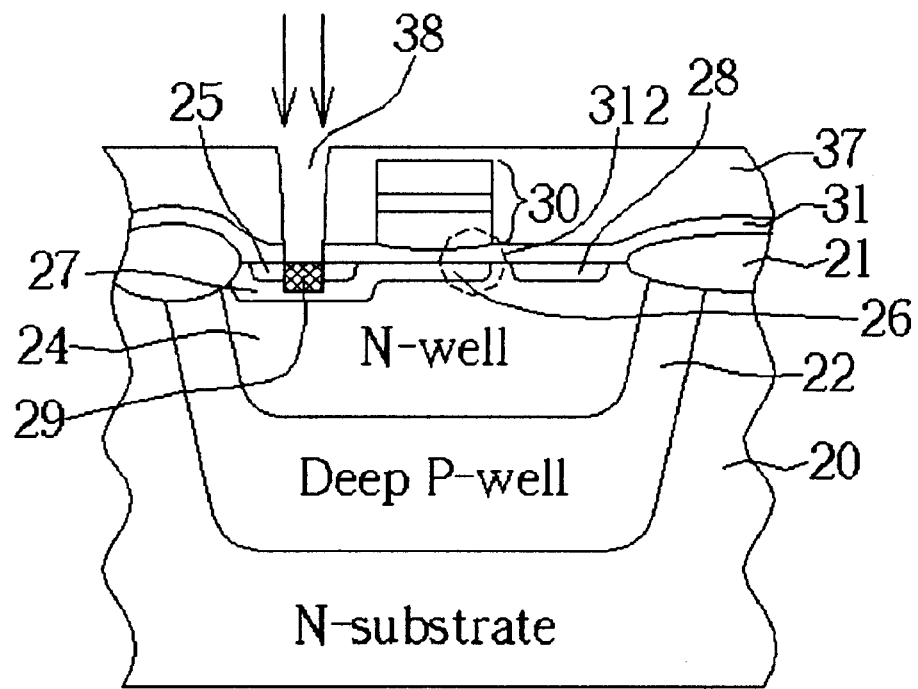
Figure 2L:
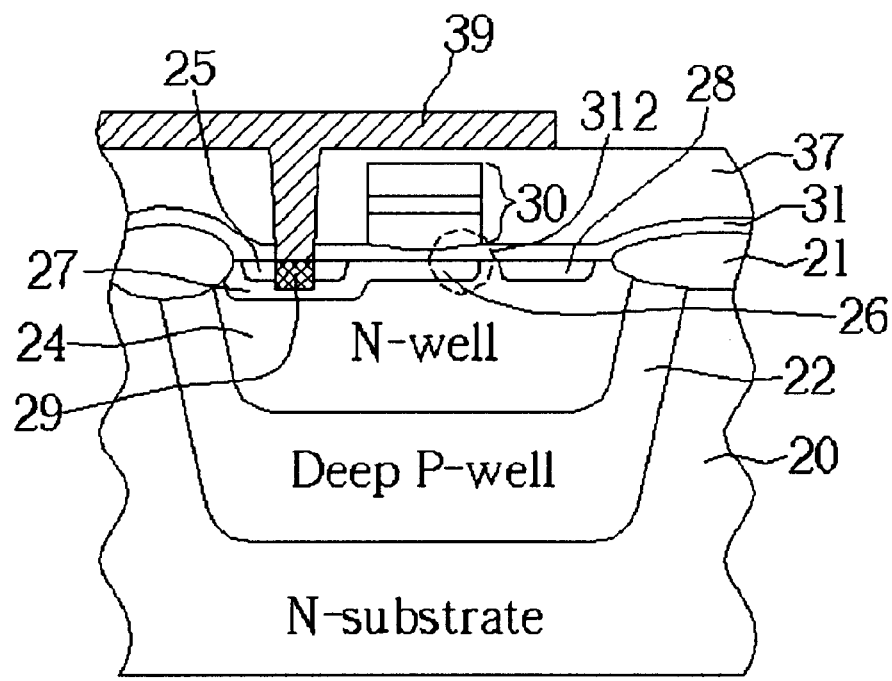

FIGS. 2A to 2L are cross-sectional views showing the process flow of a flash memory cell according to a preferred embodiment of the present invention. The fabricating method of the present invention comprises mainly the following steps:

Step A:

A semiconductor N-substrate 20 is provided; a plurality of field oxides (FOX) 21 are formed at specific regions in the substrate 20 using photolithography and oxidation techniques; a deep P-well 22 is ion-implanted in the substrate 20 between the field oxides 22, as shown in FIG. 2A;

Step B:

An N-well 24 is formed in the deep P-well 22 of the substrate 20 using ion-implantation technique, as shown in FIG. 2B;

Step C:

A shallow p-type region 26 is formed on the surface of the N-well 24 using ion-implantation technique; a tunnel oxide 31 is grown on the surface of the N-well; a first poly-Si layer 32 is then deposited and stacked on the tunnel oxide 31, as shown in FIG. 2C;

Step D:

The patterns of the tunnel oxide 31 and the first poly-Si layer 32 are defined using photolithography and etching techniques, as shown in FIG. 2D;

Step E:

An ONO film 33 is deposited on the etched tunnel oxide 31 and the etched first poly-Si layer 32; The ONO film 33 is then etched, as shown in FIG. 2E;

Step F:

A second poly-Si layer 35 is deposited and stacked on the surface of the ONO film 33, as shown in FIG. 2F;

Step G:

The second poly-Si layer 35 on the N-well 24, the ONO film 33, and the first poly-Si layer 32 are etched using anisotropic dry etching technique until the tunnel oxide 31 is exposed, thereby forming a rectangular stacked layer 30; only part of the tunnel oxide 31 straddling between two field oxides 21 is reserved; a thicker tunneling oxide is formed at the edge of the rectangular stacked layer 30 by means of oxidation to form a smiling effect oxide 312, as shown in FIG. 2G;

Step H:

A deep p-type region 27 is formed in the N-well 24 at the left side of the rectangular stacked layer 30, and a shallow p-type region 26 is formed in the N-well 24 below the rectangular stacked layer 30 using ion-implantation technique; the implanted depth of the deep p-type region 27 is larger than that of the shallow p-type region 26, as shown in FIG. 2H;

Step I:

Two n-type regions 25 and 28 are formed in the N-well 24 at two sides of the rectangular stacked layer 30 using ion-implantation technique; the n-type region 25 at the left side of the rectangular stacked layer 30 is implanted in the deep p-type region 27, as shown in FIG. 2I;

Step J:

A third poly-Si layer 37 is deposited to cover the rectangular stacked layer 30 and the exposed tunnel oxide 31 at two sides thereof, as shown in FIG. 2J;

Step K:

The insulating layer 37 at the left side of the rectangular stacked layer 30 is etched to form a contact hole 38 so as to expose the part with the deep p-type region 27 and the n-type region 25 implanted therein; the deep p-type region 27 and the n-type region 25 are electrically shorted via a metal 29, as shown in FIG. 2K; and Step L:

Connection of metals is performed; i.e., a metal contact 39 is connected to the deep p-type region 27 and the n-type region 25 via the etched contact hole 38 of the insulating layer 37, as shown in FIG. 2L.

Figure 3:
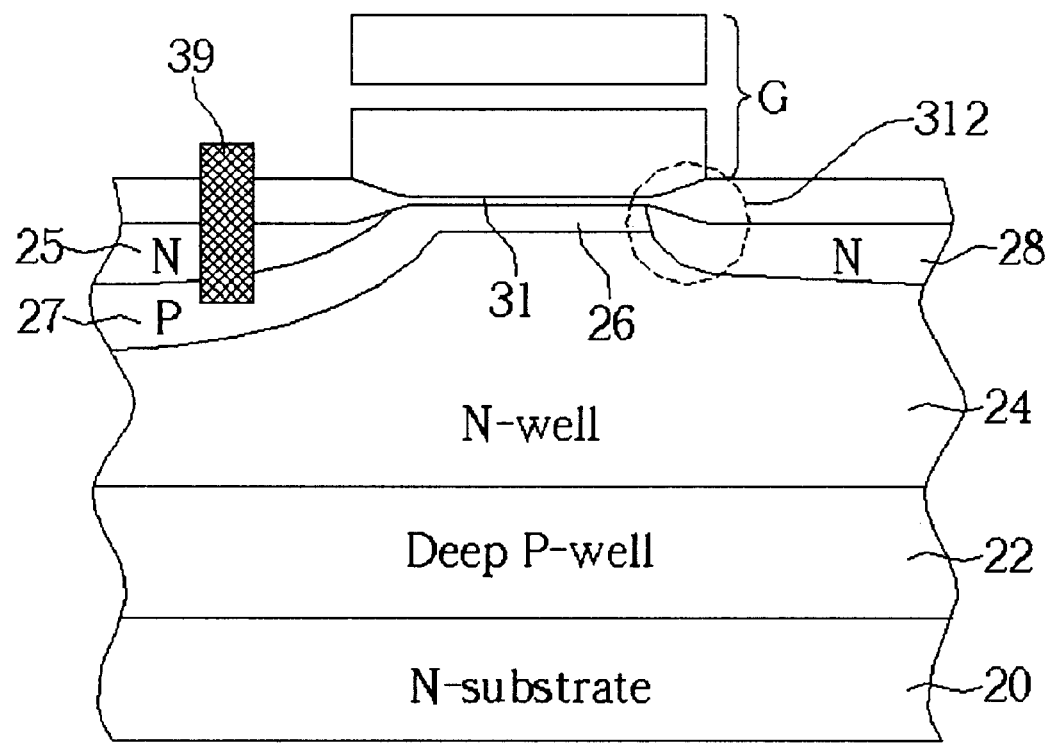
FIG. 3 is a cross-sectional view showing the operation of erasing of a flash memory cell according to the preferred embodiment of the present invention.

FIG. 3 is a cross-sectional view showing the operation of erasing of a flash memory cell according to the preferred embodiment of the present invention, wherein a deep P-well 22 is formed on an N-substrate 20, and an N-well 24 is formed on the P-well 22. A deep p-type region 27 and a shallow p-type region 26 are ion-implanted in the N-well 24. The deep p-type region 27 is connected to one end of the shallow p-type region 26. An n-type region 25 is further ion-implanted in the deep p-type region to electrically short with the deep p-type region 27 and be used as a drain. Another n-type region 28 is also implanted at one side of the shallow p-type region 26 to be used a source. Furthermore, the implanted depth of the deep p-type region 27 is larger than that of the shallow p-type region, i.e., the deep p-type region can also be used as a P-well. A tunnel oxide 31 is disposed above the N-well 24 to form a smiling effect junction with a stacked control gate G by oxidation. Thereby, program disturb generated when performing the operation of programming can be reduced through the structure change of the tunnel oxide 31. Additionally, the stacked control gate G comprises a control gate and a float gate.

Because the present invention is operated at low voltages, the same voltage can applied to the deep P-well 22 and the N-well 24 on the N-substrate 20, such as a source line voltage $V_{SL}$ and a deep P-well voltage $V_{deep\ P\text{-}well}$, to let the leakage current possibly generated be reduced to minimum. As shown in Table 1, when performing the operation of erasing, the source line voltage $V_{SL}$ is set to 8 V, the deep P-well voltage $V_{deep\ P\text{-}well}$ is set to 8 V, and a word line voltage $V_{WL}$ is set to 10 V. Thereby, the source line voltage $V_{SL}$ and the deep P-well voltage $V_{deep\ P\text{-}well}$ will balance each other so that forward bias will not be formed across a p-n junction between the deep P-well 22 and the N-substrate 20, hence reducing the leakage current.

TABLE 1

|  | Bit line voltage $V_{BL}$ | | Word line voltage $V_{WL}$ | | Source line voltage $V_{SL}$ | Deep P-well voltage $V_{deep\text{-}P\text{-}well}$ |
| --- | --- | --- | --- | --- | --- | --- |
|  | Selected | Not selected | Selected | Not selected |  |  |
| Program | 6 V | 0 V | −10 V | floating | floating | 0 V |
| Erase | floating | floating | 10 V | floating | −8 V | −8 V |
| Read | 0 V | floating | 4 V | floating | 1 V | 0 V |

Although the present invention has been described with reference to the preferred embodiment thereof, it will be understood that the invention is not limited to the details thereof. Various substitutions and modifications have been suggested in the foregoing description, and other will occur to those of ordinary skill in the art. P-type semiconductors and n-type semiconductors can interchange each other in the structure of the present invention. For instance, the triple well structure of N-well/deep P-well/N-substrate can be replaced with a triple well structure of P-well/deep N-well/P-substrate. Therefore, all such substitutions and modifications are intended to be embraced within the scope of the invention as defined in the appended claims.

What is claimed is:

1. A fabricating method of a low-voltage channel write/erase flash memory cell, comprising mainly the steps of:
   a. ion-implanting a deep P-well in an N-substrate;
   b. ion-implanting an N-well in said deep P-well;
   c. ion-implanting a shallow p-type region on the surface of said N-well;
   d. growing a tunnel oxide on said shallow p-type region and depositing a poly-Si layer;
   e. etching said tunnel oxide and said poly-Si layer;
   f. etching out an oxide-nitride-oxide (ONO) film on said etched tunnel oxide and said etched poly-Si layer;
   g. depositing a poly-Si layer on said oxide-nitride-oxide (ONO) film;
   h. etching all grown layers and deposited layers on said oxide to form a rectangular stacked layer with exposed regions of said tunnel oxide region at two sides thereof;
   i. performing oxidation to form a smiling effect oxide between said rectangular stacked layer and the surface of said N-well;
   j. ion-implanting a deep p-type region at one side of said rectangular stacked layer and in said N-well; and
   k. ion-implanting a plurality of n-type regions in said N-well and at two sides of said rectangular stacked layer.

2. The fabricating method of a flash memory cell as claimed in claim 1, wherein said deep p-type region in said Step j is connected to one side of said shallow p-type region, and the implanted depth of said deep p-type region is larger than that of said shallow p-type region.

3. The fabricating method of a flash memory cell as claimed in claim 1, wherein one of said n-type regions in said Step k is disposed in said deep p-type region.

4. The fabricating method of a flash memory cell as claimed in claim 1 further comprising the following steps:
   l. depositing a poly-Si layer to cover said rectangular stacked layer and two sides thereof;
   m. etching said poly-Si layer disposed at one side of said rectangular stacked layer to form a contact hole so as to expose said N-well having said deep p-type region and said n-type region thereon; and
   n. providing a metal contact in said etched contact hole of said poly-Si layer to join said N-well having said deep p-type region and said n-type region thereon.

5. The fabricating method of a flash memory cell as claimed in claim 1, wherein said p-type semiconductors and said n-type semiconductors in each step can interchange each other, e.g., an npn structure can be replaced with a pnp structure.

* * * * *